United States Patent
Colarossi et al.

(10) Patent No.: US 11,682,893 B2
(45) Date of Patent: *Jun. 20, 2023

(54) SQUIB DIVER CIRCUIT FOR A DEPLOYABLE RESTRAINT INCLUDING AN INTEGRATED CIRCUIT AND A VOLTAGE REGULATOR

(71) Applicant: VEONEER US, INC., Southfield, MI (US)

(72) Inventors: Vincent Colarossi, Southfield, MI (US); Bankim Patel, Southfield, MI (US)

(73) Assignee: Veoneer US, LLC, Southfield, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/375,744

(22) Filed: Jul. 14, 2021

(65) Prior Publication Data

US 2021/0344189 A1 Nov. 4, 2021

Related U.S. Application Data

(63) Continuation of application No. 15/849,456, filed on Dec. 20, 2017, now Pat. No. 11,101,636.

(51) Int. Cl.
*H02H 3/16* (2006.01)
*H02H 1/00* (2006.01)
(Continued)

(52) U.S. Cl.
CPC ............ *H02H 3/16* (2013.01); *B60R 21/017* (2013.01); *H02H 1/0007* (2013.01); *H02H 7/20* (2013.01)

(58) Field of Classification Search
CPC ................... B60N 2/002; B60R 16/03; B60R 2021/01143; B60R 2021/01163;
(Continued)

(56) References Cited

U.S. PATENT DOCUMENTS

| 5,656,991 | A  | * | 8/1997 | Hargenrader | ....... B60R 21/0173 340/661 |
| 6,597,181 | B2 | * | 7/2003 | Boran | ................ B60R 21/0173 324/525 |
| 6,713,993 | B2 |   | 3/2004 | Descombes | |
| 7,209,819 | B2 | * | 4/2007 | Rothleitner | ....... B60R 21/01556 307/10.6 |
| 7,268,596 | B2 | * | 9/2007 | Ota | ................... H03K 17/04206 327/112 |
| 7,868,400 | B2 | * | 1/2011 | Graovac | ............... B60R 21/017 307/115 |

(Continued)

FOREIGN PATENT DOCUMENTS

| JP | 2002-023867 A | 1/2002 |
| JP | 2003-067061 A | 3/2003 |
| JP | 2008-265614 A | 11/2008 |

OTHER PUBLICATIONS

Office Action regarding corresponding JP App. No. 2020-520749; dated Oct. 12, 2022.

*Primary Examiner* — Jared Fureman
*Assistant Examiner* — Nicolas Bellido
(74) *Attorney, Agent, or Firm* — Dickinson Wright PLLC

(57) ABSTRACT

A squib driver circuit for deployment of a deployable restraint in a vehicle. The safety restraint may have a minimum firing voltage. The voltage regulator may regulate the input voltage to be the minimum firing voltage at the input terminal. The squib driver circuit may be formed on a single chip. The squib driver circuit may include a high side driver and a low side driver. An input terminal for receiving an input voltage used to fire the deployable restraint. The high side driver may supply current from the input terminal to the deployable restraint. The low side driver may supply current from deployable restraint to the electrical ground.

20 Claims, 14 Drawing Sheets

(51) Int. Cl.
    *H02H 7/20* (2006.01)
    *B60R 21/017* (2006.01)
(58) Field of Classification Search
    CPC ....... B60R 2021/01184; B60R 21/0133; B60R 21/017; B60R 21/0173; B60R 21/0176; B60R 21/207; B60R 21/2072; B60R 21/21658; B64C 27/006; G01R 31/021; G01R 31/025; G01R 31/2829; G01R 31/3842; G05F 1/462; G05F 1/59; G06F 1/03; H01M 2010/4278; H02H 1/0007; H02H 3/027; H02H 3/14; H02H 3/16; H02H 3/305; H02H 7/18; H02H 7/20; H02H 9/046; H02M 3/155; H02M 3/156; H03K 17/08148; H03K 19/20
    See application file for complete search history.

(56) References Cited

U.S. PATENT DOCUMENTS

| | | | |
|---|---|---|---|
| 7,881,037 B2 | 2/2011 | Ueda | |
| 10,170,994 B1* | 1/2019 | Gibney | H02M 3/156 |
| 10,840,692 B2* | 11/2020 | Colarossi | H03K 17/0822 |
| 10,840,900 B2* | 11/2020 | Colarossi | H03K 17/08148 |
| 10,892,613 B2* | 1/2021 | Colarossi | H03K 17/0822 |
| 11,101,636 B2* | 8/2021 | Colarossi | H02H 7/20 |
| 2002/0050826 A1* | 5/2002 | Boran | B60R 21/0173 |
| | | | 324/525 |
| 2010/0165538 A1* | 7/2010 | Hemon | B60R 21/017 |
| | | | 361/248 |
| 2014/0277949 A1* | 9/2014 | Ito | B60R 21/26 |
| | | | 701/45 |

\* cited by examiner

US 11,682,893 B2

SQUIB DIVER CIRCUIT FOR A DEPLOYABLE RESTRAINT INCLUDING AN INTEGRATED CIRCUIT AND A VOLTAGE REGULATOR

CROSS REFERENCE TO RELATED APPLICATIONS

This U.S. utility patent application is a continuation of U.S. Non-Provisional patent application Ser. No. 15/849,456, filed Dec. 20, 2017, the contents of which is incorporated herein by reference in its entirety.

BACKGROUND

The present application relates generally to a voltage regulator integrated into a squib driver circuit.

An airbag system typically includes a restraint control module, a reaction canister, an air bag, and an inflator with ignitor (squib) that are stored inside the reaction canister. The inflator with squib is connected to the restraint control module via conductive wires and connectors. The total electrical path of these wires and connectors to and from the inflator is termed "squib loop". The restraint control module provides sufficient energy to the inflator through the squib loop to provide airbag actuation. The inflator is actuated by the restraint control module once appropriate signals are received from vehicle sensors are sufficient to warrant airbag activation. The restraint control module controls the overall operation of the air bag system and can be viewed as the main control unit for the air bag system.

As with any electrical system that consists of sensors, airbag, wiring and connectors etc, the system requires electrical connections to operate properly. Specifically, in airbag safety systems is determined by customer demand that diagnostic capability be implemented in the restraint control module to interrogate the squib loop for proper squib loop resistance value as well as other characteristics that may prevent the air bag from being activated improperly.

BRIEF SUMMARY

A method and system for protecting the squib loop drivers in a restraint control module is disclosed in the present application. The deployment function of the restraint control module is provided by the activation of the squib loop drivers to send the all-fire current for the specified all-fire time through the ignitor. The squib loop drivers are comprised of both a high-side and a low-side squib driver. The squib driver protection concept is to attempt the deployment function until a system fault occurs. If a system fault occurs then the deployment function will be terminated in order to protect the squib loop drivers. System faults may include short circuit to Ground, shorted squib load, short circuit to Vbat (e.g. vehicle battery voltage), faulted energy reserve supply, and others.

Further objects, features and advantages of this application will become readily apparent to persons skilled in the art after a review of the following description, with reference to the drawings and claims that are appended to and form a part of this specification.

BRIEF DESCRIPTION OF THE DRAWINGS

In the accompanying drawings the components are not necessarily to scale, emphasis instead being placed upon illustrating the principles of the application. Moreover, like reference numerals designate corresponding parts throughout the views.

DETAILED DESCRIPTION

Airbag safety restraint systems typically employ a single inflator device to produce inflation gas for inflating a vehicle occupant restraint airbag the event of a collision. The inflator device is controlled by a squib driver circuit. The squib driver circuit may include a high side driver and as low side driver implemented on a single deployment chip.

Figure 1:
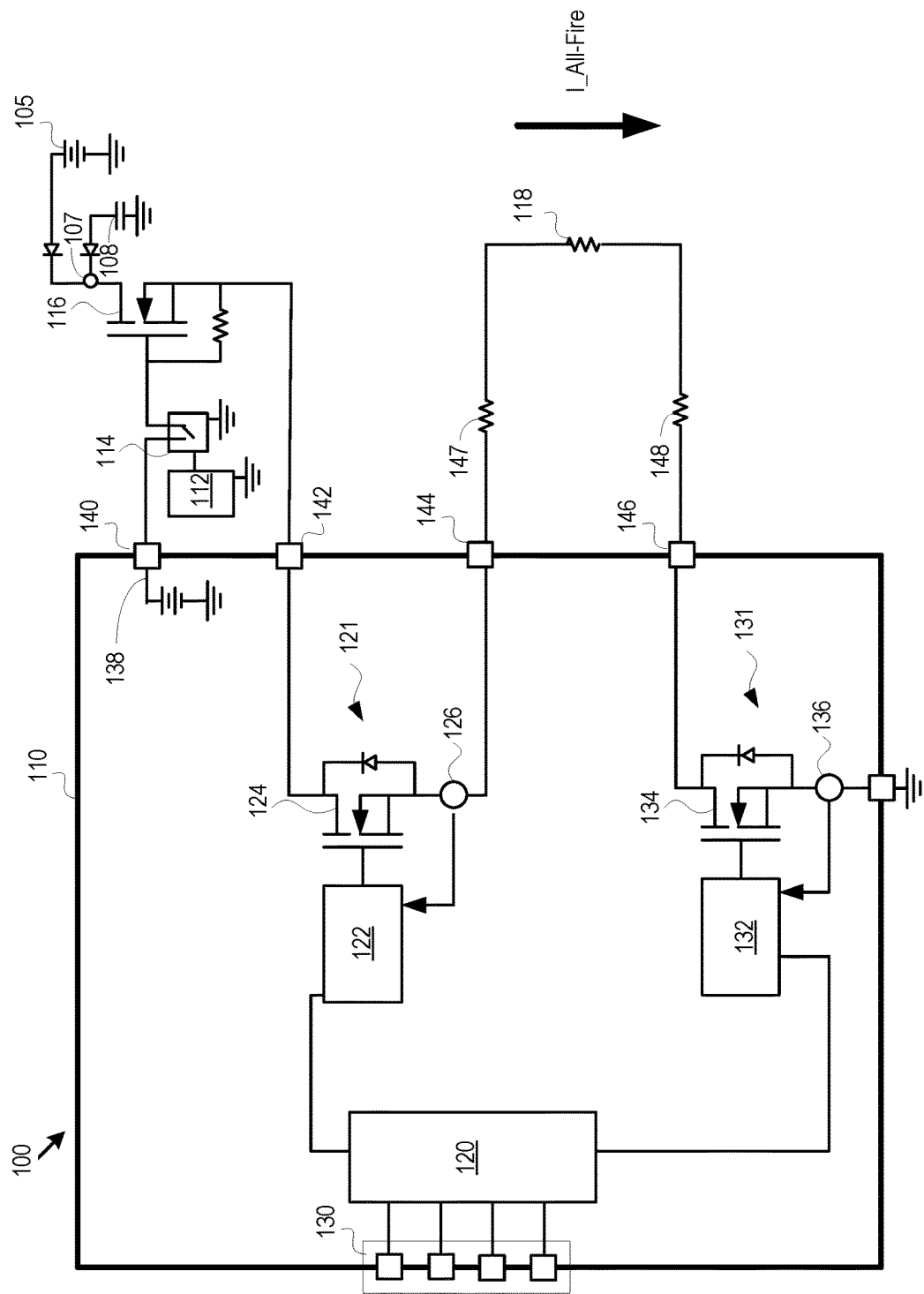
FIG. 1 is a schematic illustration of a squib driver circuit.

FIG. 1 is a schematic illustration of a squib driver circuit 100. The squib driver circuit includes a deployment chip 110. The deployment chip 110 may be a single silicon chip, for example, an ASIC (Application Specific Integrated Circuit). The deployment chip 110 may include an input terminal ($SS_{xy}$) 142 for receiving an input voltage. The input voltage may be used to fire a deployable restraint such as an air bag. The input terminal ($SS_{xy}$) 142 may receive the input voltage from a battery such as vehicle battery 105. A switch 116 such as the power transistor may be located between the input terminal ($SS_{xy}$) 142 and the battery 105. The battery 105 may be connected to the switch 116 through a diode, further the switch may be connected to an electrical ground though a diode and capacitor ($C_{ER}$) 108.

The switch 116 may control power provided to the input terminal 142 from the battery 105 as directed by an enable switch 114. The enable switch 114 may receive enable voltage 138 from an output terminal (VSF) 140 of the deployment chip 110. The output voltage may be provided from the output terminal 140 (VSF) to the enable switch 114. The microprocessor control circuit 112 may control the enable switch 114. When the enable switch 114 is active, the enable voltage may be provided to activate switch 116 allowing the battery 105 to provide power to the input terminal ($SS_{xy}$) 142. In some implementations, the enable switch 114 may be connected to the gate of a power transistor thereby acting as a switch or regulator allowing the battery 105 to provide power to the input terminal ($SS_{xy}$)

142. In some implementations, the switch 116 may be an N-channel MOSFET with a drain in connection with the battery 105 and a source in connection with the input terminal ($SS_{xy}$) 142. In this implementation, a resistor may be placed between the gate and source to allow proper operation. The switch 116 can be a MOSFET that provides two functions: Firstly, switch 116 can provide a redundant silicon control path that can prevent deployment in case of system failure where, for example Switch 116 is disabled and switches 124 and 134 of deployment chip 110 become active due to a common failure mode. Secondly, switch 116 can provide a reduced and more controlled $V(SS_{xy},0)$ 142 when implemented as a pass element part of a closed loop regulator control path and hence absorb more power and provide a lower level of power dissipation on the expensive ASIC squib driver transistors to minimize system cost.

The input terminal ($SS_{xy}$) 142 may be connected to a high side driver circuit 121. The high side driver circuit 121 may be connected between the input terminal 142 and the high side feed terminal 144. In one implementation, a power transistor 124 may be connected between the input terminal ($SS_{xy}$) 142 and the high side feed terminal ($SF_x$) 144. The power transistor 124 may be an N-channel MOSFET with a drain connected to the input terminal ($SS_{xy}$) 142 and a source connected to the high side feed terminal ($SF_x$) 144. A gate of the power transistor 124 may be connected to a high side gate driver circuit 122. In some implementations, a current sensor 126 may provide a current signal to the high side gate driver circuit 122. The gate driver circuit 122 may utilize the current signal to control activation of the power transistor 124 in response to the amount of current flow. The current sensor 126 may be located between the power transistor 124 and the high side feed terminal ($SF_x$) 144. The high side feed terminal ($SF_x$) 144 may be connected to an ignitor (R_ignitor) 118 through a feed wire (R_Wire_Feed) 147. The current may be returned from the ignitor 118 through a return wire (R_Wire_Return) 148 to a low side return terminal ($SR_x$) 146.

A low side driver circuit 131 may be connected between the low side return terminal 146 and an electrical ground. In one implementation, a power transistor 134 may be connected between the return terminal ($SR_x$) 146 and the electrical ground. The power transistor 134 may be an N-channel MOSFET with a drain connected to the return terminal ($SR_x$) 146 and a source connected to the electrical ground. A gate of the power transistor 134 may be connected to a low side gate driver circuit 132. In some implementations, a current sensor 136 may provide a current signal to the low side gate driver circuit 132. The gate driver circuit 132 may utilize the current signal to control activation of the power transistor 134 in response to the amount of current flow. The current sensor 136 may be located between the power transistor 134 and the electrical ground.

A digital control circuit 120 may receive commands from a communication interface 130, such as a serial communication interface. The commands provided to the digital circuit 120 through the communication interface 130 may include an enable command, an all fire command, as well as various configuration commands to set timer durations or thresholds for various components such as the high side gate driver 122 or the low side gate driver 132.

The wire, connectors, clock-springs, EMI inductors and squib may all be comprised of linear conductive components and can be combined or simplified into an equivalent resistance of R_Wire_Feed (resistance of the feed wire 147) and R_Wire_Return (resistance of the return wire 148). The pyrotechnic device with the ignitor is represented by R_Ignitor (resistance of the ignitor circuit 118). Assuming R_Wire_Feed=0 Ohm, R_Wire_Return=0 Ohm, The effects on the high side driver (HSD) and the low side driver (LSD) can be estimated. Considering no fault conditions as shown in FIG. 1, the energy absorbed by the HSD (E_HSD) and the energy absorbed by the LSD (E_LSD) is $$E\_HSD=[(V(SS_{xy},0)-I\_All\text{-}Fire*(R\_Ignitor+Rdson\_LSD))*I\_All\text{-}Fire]*T\_All\text{-}Fire$$

$$E\_LSD=[I\_All\text{-}Fire^2*(Rdson\_LSD)]*T\_All\text{-}Fire$$

Where $V(SS_{xy},0)$ [142] is the voltage between pin $SS_{xy}$ and ground (e.g. 33 V), I_All-Fire is the current required to fire the deployable devices (e.g. 1.75 A, 1.2 A), Rdson_LSD is the resistance of the low side driver (e.g. 1 Ohm, resistance across transistor 134), T_All-Fire is the amount required to fire all of the deployable devices (e.g. 500 μseconds, 2000 μseconds).

Figure 2:
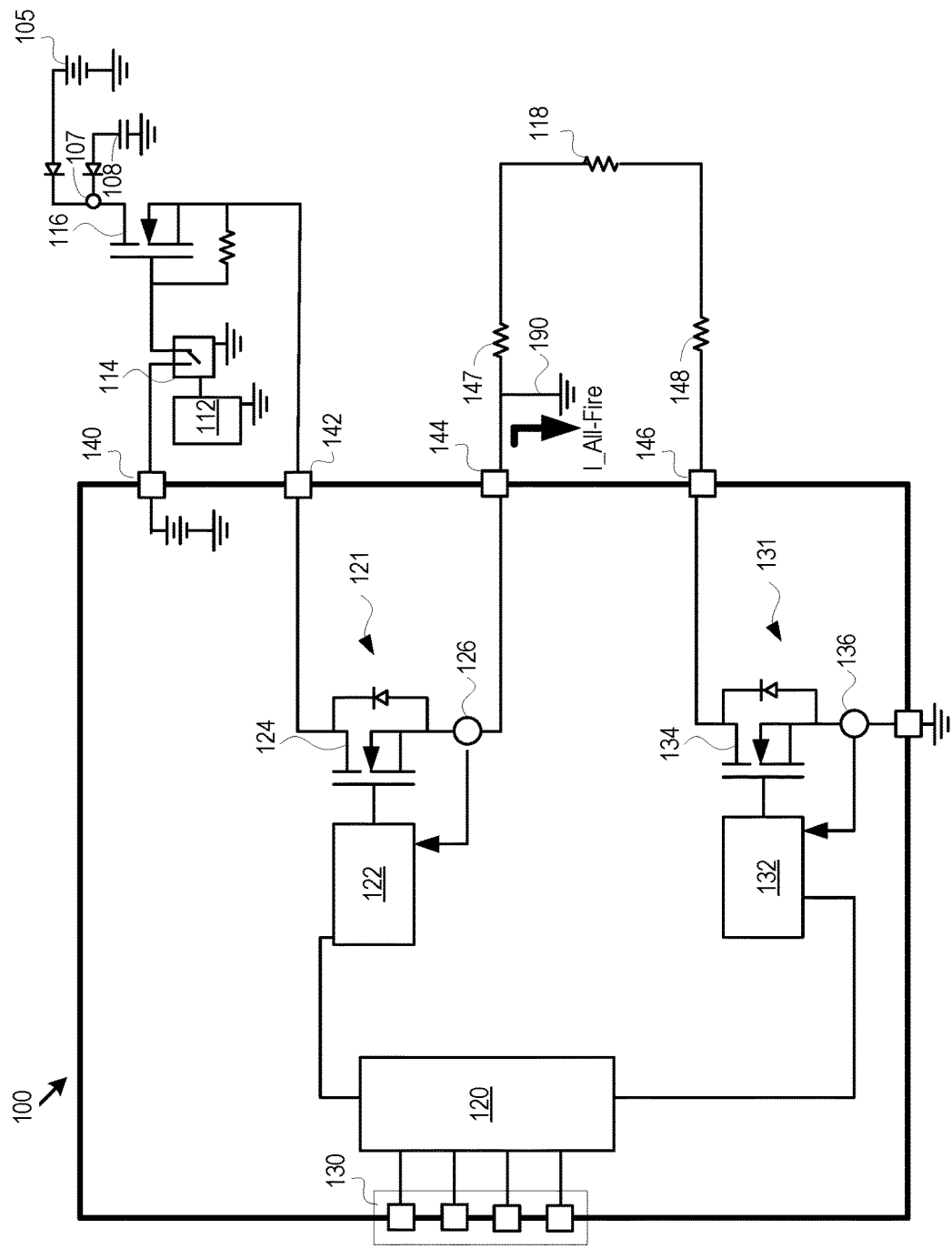
FIG. 2 is a schematic illustration of a short to ground fault for the squib driver circuit of FIG. 1.

One fault condition may include a short of the $SF_x$ (high side feed terminal 144) to ground. A simulated illustration of this fault is provided by the ground 190 in FIG. 2. Considering the system when driving a faulted condition of $SF_x$ pin short circuit to ground and impact to the HSD, the energy absorbed by the HSD and LSD is $$E\_HSD=[(V(SS_{xy},0))*I\_All\text{-}Fire]*T\_All\text{-}Fire$$

$$E\_LSD=0 \text{ joules}$$

Figure 3:
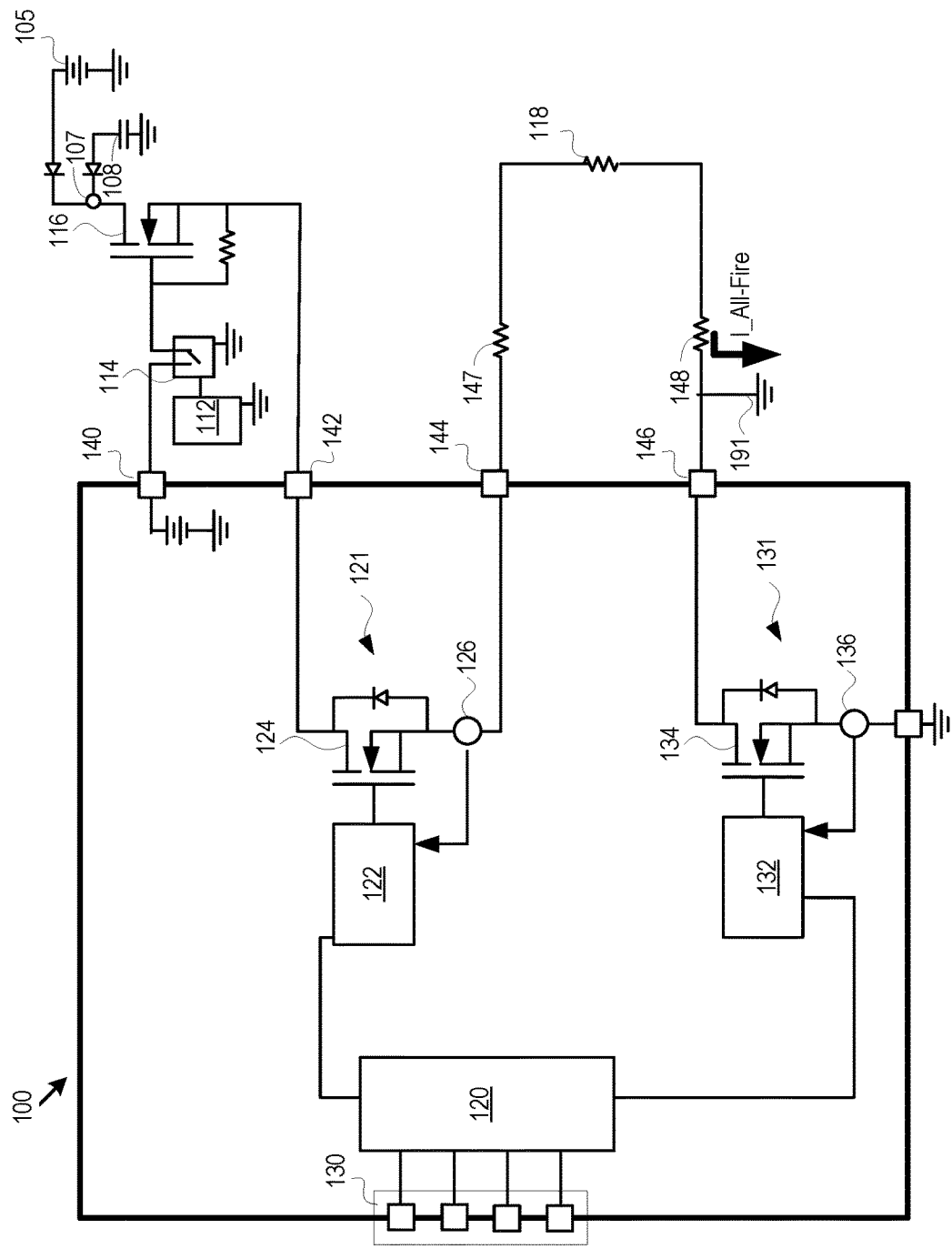
FIG. 3 is a schematic illustration of a short to ground fault for the squib driver circuit of FIG. 1.

One fault condition may include a short of the $SR_x$ pin (low side return terminal 146) to ground. A simulated illustration of this fault is provided by the ground 191 in FIG. 3. Considering the system driving a faulted condition of $SR_x$ pin short circuit to ground and impact to the HSD, the energy absorbed by the HSD and LSD is $$E\_HSD=[(V(SS_{xy},0)-(I\_All\text{-}Fire*R\_Ignitor))*I\_All\text{-}Fire]*T\_All\text{-}Fire$$

$$E\_LSD=0 \text{ joules}$$

Figure 4:
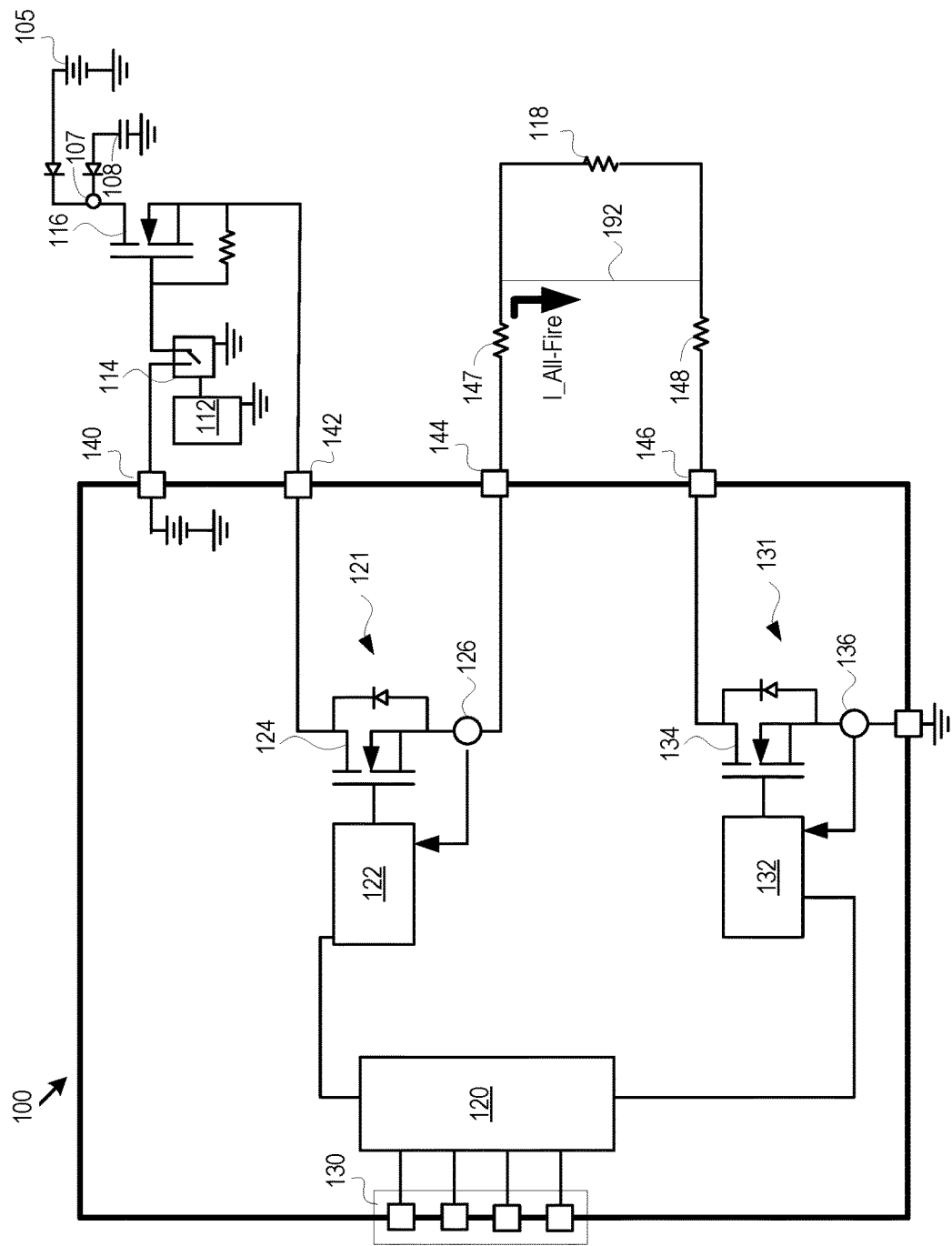
FIG. 4 is a schematic illustration of a shorted squib load fault for the squib driver circuit of FIG. 1.

Another fault condition may include a short of the $SF_x$ pin (high side feed terminal 144) to the $SR_x$ pin (low side return terminal 146). A simulated illustration of this fault is provided by the shunt 192 in FIG. 4. Considering the system when driving a faulted condition of $SF_x$ pin short to $SR_x$ pin (shorted squib load) and impact to the HSD, the energy absorbed by the HSD and LSD is $$E\_HSD=[(V(SS_{xy},0)-I\_All\text{-}Fire*(Rdson\_LSD))*I\_All\text{-}Fire]*T\_All\text{-}Fire$$

$$E\_LSD=[I\_All\text{-}Fire^2*(Rdson\_LSD)]*T\_All\text{-}Fire$$

Figure 5:
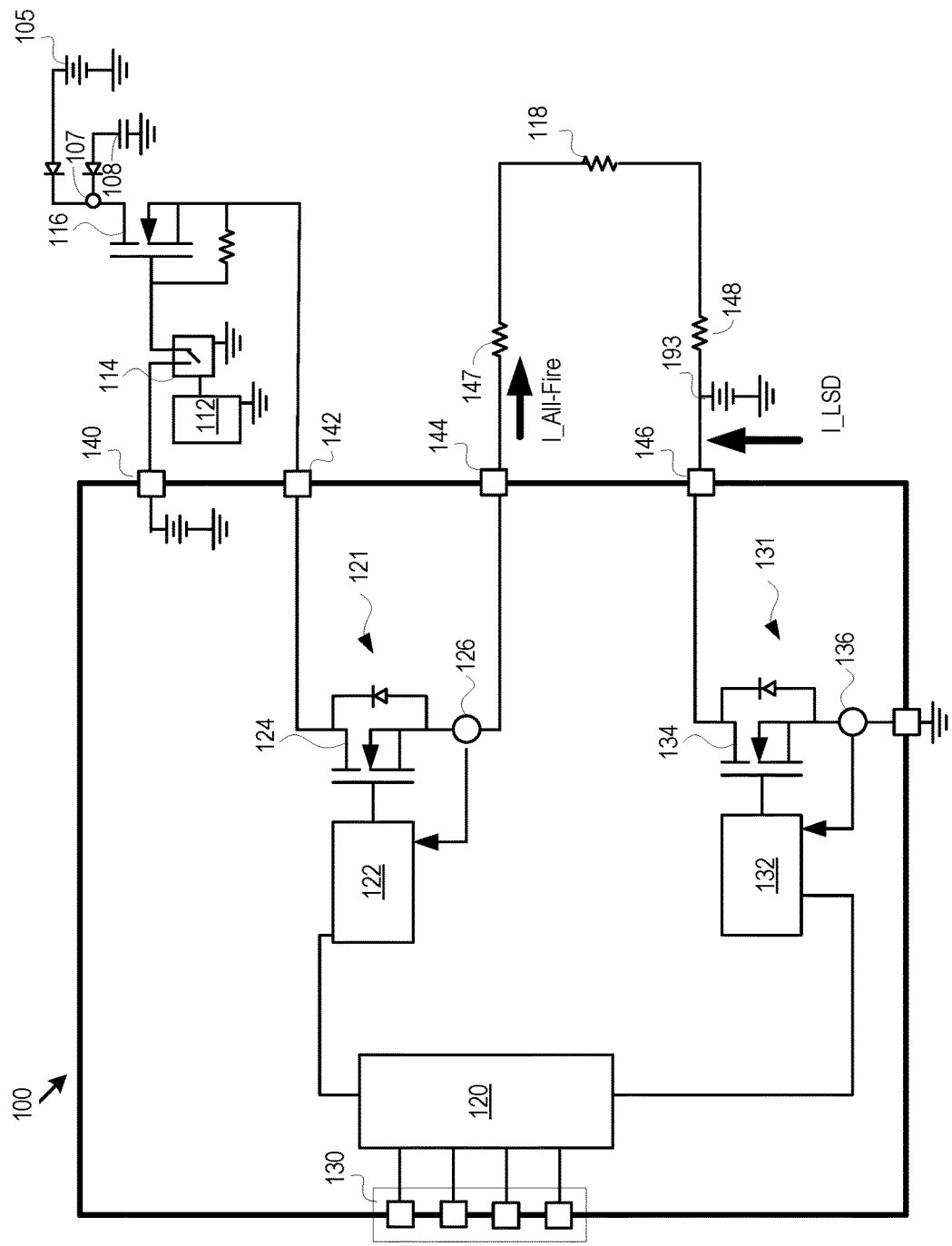
FIG. 5 is a schematic illustration of short to battery fault for the squib driver circuit of FIG. 1.

Another fault condition may include a short of the $SR_x$ pin (low side return terminal 146) to battery voltage. A simulated illustration of this fault is provided by the battery 193 in FIG. 5. Considering the system when driving a faulted condition of $SR_x$ pin short to Vbat and impact to the LSD, the energy absorbed by the HSD and LSD is $$E\_HSD=[(V(SS_{xy},0)-(I\_All\text{-}Fire*R\_Ignitor)-Vbat)*I\_All\text{-}Fire]*T\_All\text{-}Fire$$

$$E\_LSD=[I\_LSD*Vbat]*T\_All\text{-}Fire$$

Figure 6:
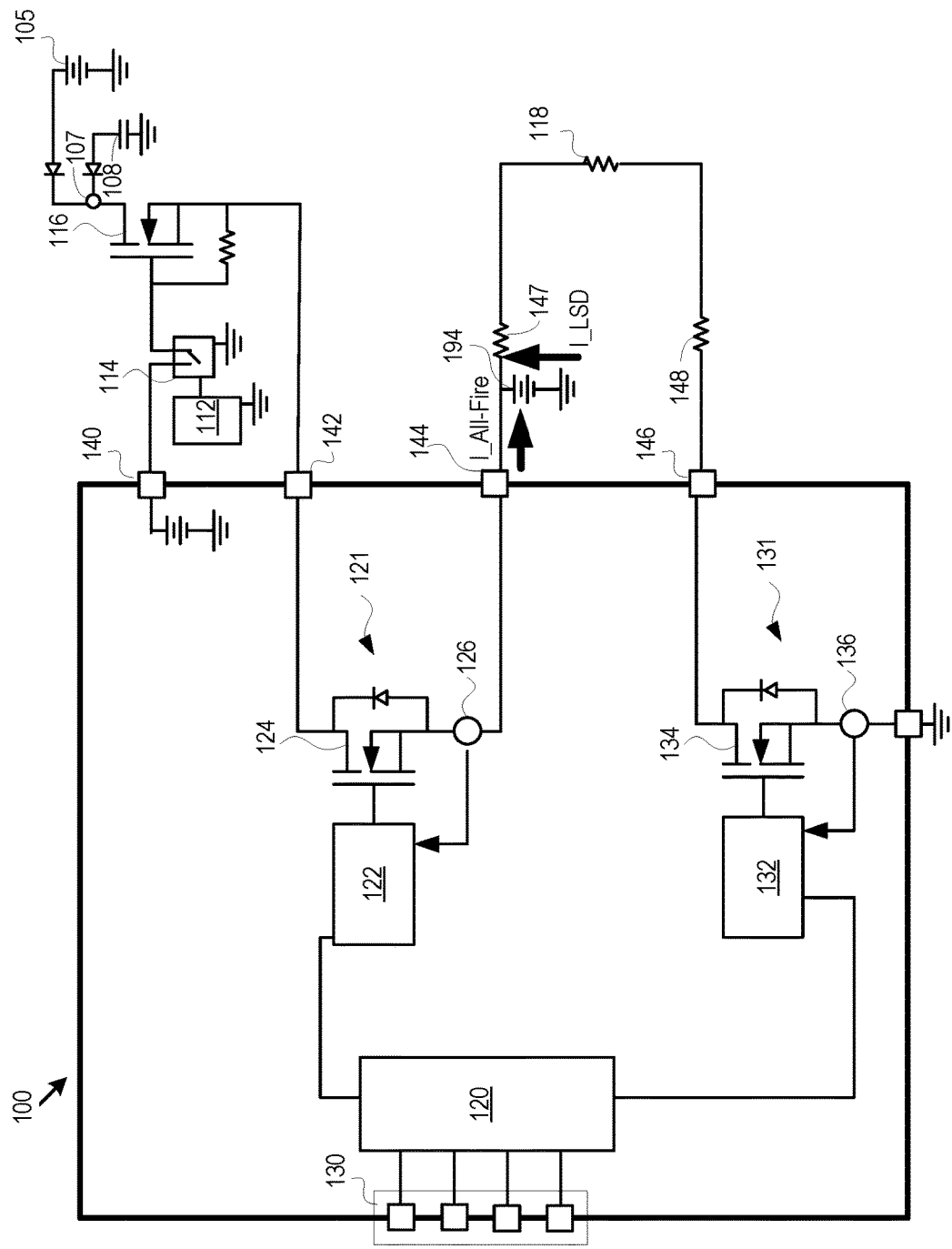
FIG. 6 is a schematic illustration of short to battery fault for the squib driver circuit of FIG. 1.

Another fault condition may include a short of the $SF_x$ pin (high side feed terminal 144) to battery voltage. A simulated illustration of this fault is provided by the battery 194 in FIG. 6. Considering the system when driving a faulted condition of $SF_x$ pin short to Vbat and impact to the LSD, the energy absorbed by the HSD and LSD is $$E\_HSD=[(V(SS_{xy},0)-Vbat)*I\_All\text{-}Fire]*T\_All\text{-}Fire$$

$$E\_LSD=[(Vbat-(I\_LSD*R\_Ignitor))*I\_LSD]*T\_All\text{-}Fire$$

Figure 7:
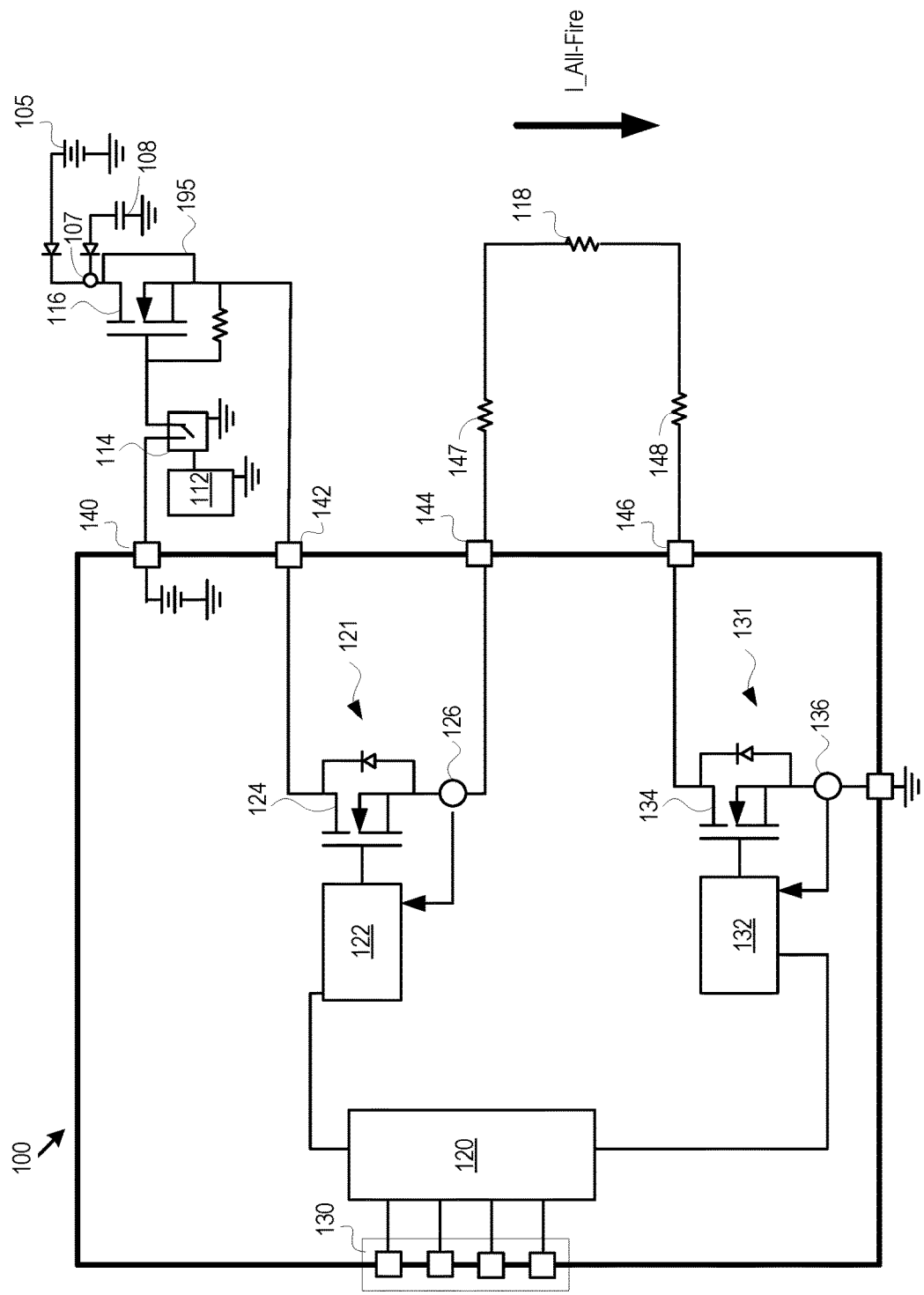
FIG. 7 is a schematic illustration of a faulty external transistor for the squib driver circuit of FIG. 1.

Another fault condition may include a faulty external transistor. A simulated illustration of this fault is provided by the shunt 195 in FIG. 7. Considering the system when driving a faulted condition of external transistor and impact to the HSD, the energy absorbed by the HSD and LSD is $$E\_HSD=[(V_{ER})-I\_All\text{-}Fire*(R\_Ignitor+Rdson\_LSD))*I\_All\text{-}Fire]*T\_All\text{-}Fire$$

$$E\_LSD=[I\_All\text{-}Fire^2*(Rdson\_LSD)]*T\_All\text{-}Fire$$

Where $V_{ER}$ is the voltage at node 107 (e.g. 33V)

Figure 8:
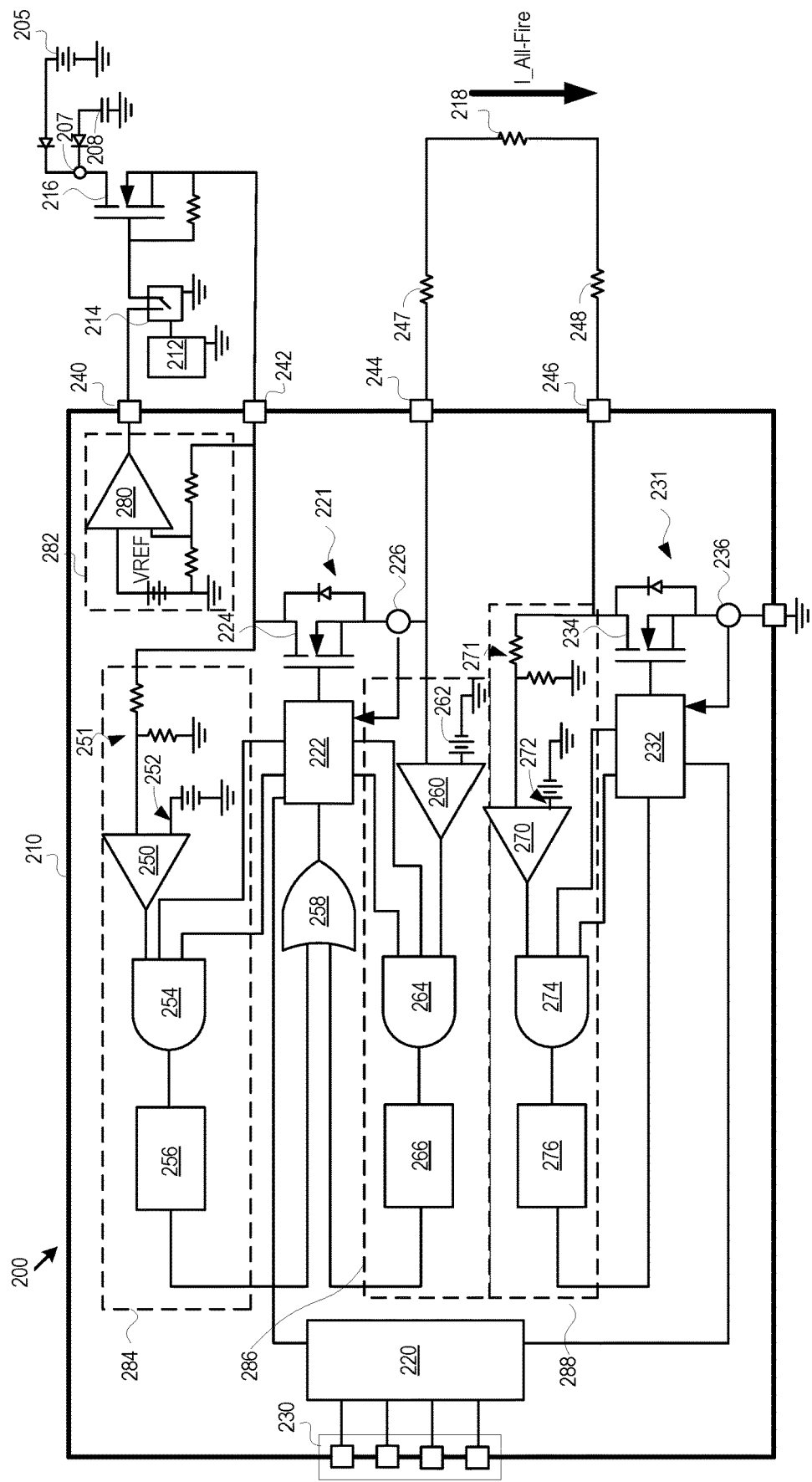
FIG. 8 is a schematic illustration of another implementation of a squib driver circuit.

FIG. 8 is a schematic illustration of another squib driver circuit 200. The squib driver circuit includes a deployment chip 210. The deployment chip 210 may be a single silicon chip, for example, an ASIC (Application Specific Integrated Circuit). The deployment chip 210 may include an input terminal 242 for receiving an input voltage. The input voltage may be used to fire a deployable restraint such as an air bag. The input terminal 242 may receive the input voltage from a battery such as vehicle battery 205. A switch 216 such as the power transistor may be located between the input terminal 242 and the battery 205.

The switch 216 may control power provided to the input terminal 242 from the battery as directed by an enable switch 214. The enable switch 214 may receive enable voltage from an output terminal 240 of the deployment chip 210. The output voltage may be provided from the output terminal 240 to the enable switch 214. The microprocessor control circuit 212 may control the enable switch 214. When the enable switch 214 is active, the enable voltage may be provided to activate switch 216 allowing the battery to provide power to the input terminal 242. In some implementations, the enable switch 214 may be connected to the gate of a power transistor thereby acting as a switch or regulator allowing the battery 205 to provide power to the input terminal 242. In some implementations, the switch 216 may be an N-channel MOSFET with a drain in connection with the battery 205 and a source in connection with the input terminal 242. In this implementation, a resistor may be placed between the gate and source to allow proper operation. The switch 216 can be a MOSFET that provides two functions: Firstly, switch 216 can provide a redundant silicon control path that can prevent deployment in case of system failure where, for example switch 216 is disabled and switches 221 and 231 of deployment chip 210 become active due to a common failure mode. Secondly, switch 216 can provide a reduced and more controlled V(SSxy,0) 242 when implemented as a pass element part of a closed loop regulator control path and hence absorb more power and provide a lower level of power dissipation on the expensive ASIC squib driver transistors to minimize system cost.

The input terminal 242 may be connected to a high side driver circuit 221. The high side driver circuit 221 may be connected between the input terminal 242 and the high side feed terminal 244. In one implementation, a power transistor 224 may be connected between the input terminal 242 and the high side feed terminal 244. The power transistor 224 may be an N-channel MOSFET with a drain connected to the input terminal 242 and a source connected to the high side feed terminal 244. A gate of the power transistor 224 may be connected to a high side gate driver circuit 222. In some implementations, a current sensor 226 may provide a current signal to the high side gate driver circuit 222. The gate driver circuit 222 may utilize the current signal to control activation of the power transistor 224 in response to the amount of current flow. The current sensor 226 may be located between the power transistor 224 and the high side feed terminal 244. The high side feed terminal 244 may be connected to an ignitor 218 through a feed wire having a resistance 247. The current may be returned from the ignitor 218 through a return wire having a resistance 248 to a low side return terminal 246.

A low side driver circuit 231 may be connected between the low side return terminal 246 and an electrical ground. In one implementation, a power transistor 234 may be connected between the return terminal 246 and the electrical ground. The power transistor 234 may be an N-channel MOSFET with a drain connected to the return terminal 246 and a source connected to the electrical ground. A gate of the power transistor 234 may be connected to a low side gate driver circuit 232. In some implementations, a current sensor 236 may provide a current signal to the low side gate driver circuit 232. The gate driver circuit 232 may utilize the current signal to control activation of the power transistor 234 in response to the amount of current flow. The current sensor 236 may be located between the power transistor 234 and the electrical ground.

A digital control circuit 220 may receive commands from a communication interface 230, such as a serial communication interface. The commands provided to the digital circuit 220 through the communication interface 230 may include an enable command, an all fire command, as well as various configuration commands to set timer durations or thresholds for various components such as the high side gate driver 222 or the low side gate driver 232.

A voltage regulator 282 may be provided between output terminal 240 and input terminal 242. The voltage regulator includes an amplifier 280, with a voltage divider connected to one input of the amplifier 280, and the other input connected to an electrical ground. The output of the amplifier 280 is connected to the output terminal 240.

The role of the voltage regulator 282 can be two-fold. First, the voltage regulator 282 may provide a reduced level of voltage to the squib driver $SS_{xy}$ pin (input terminal 242) to provide the deployment function. This also reduces the absorbed energy of the squib drivers while providing the deployment function into the normally expected conditions, as well as, during some fault conditions. The second role of the regulator may be to provide less variation in the expected value of the squib driver $SS_{xy}$ pin (input terminal 242) to again reduce absorbed energy of the squib drivers. As such, the voltage regulator 282 may keep the voltage at the input terminal 242 at the minimum level needed for firing the safety device. In some implementations the minimum voltage level may be 10-20V volts depending on the firing current and loop resistance.

A high side short to battery & Faulty $SS_{xy}$ protection circuit 284 may include a comparator 250. The comparator 250 may be configured to compare at the voltage input terminal 242 to a reference voltage 252. In some implementations, the voltage at the input terminal 242 may be scaled using a voltage divider 251. As such, the comparator 250 may determine if the voltage at the input terminal 242 exceeds the reference voltage 252 and generate a voltage limit signal that indicates the voltage at the terminal 242 has exceeded the reference voltage 252. In addition, the high side gate driver circuit 222 may generate a current limit signal indicating that the current through the power transistor 224 has exceeded a current threshold. Further, the high side gate driver circuit 222 may generate an active signal indicating that high side gate driver has been activated, for example, by the digital control circuit 220. An AND circuit 254 may receive the voltage limit signal, the current limit signal, and the active signal. The AND circuit 254 may generate a condition signal that is provided to a delay timer 256. The AND circuit 254 may generate the condition signal based on one of or a combination of the active signal, the current limit signal, and the voltage limit signal. For example, the AND circuit 254 may generate the condition signal based on the current limit signal and the voltage limit signal, or the voltage limit and the active signal. In one particular implementation, the AND circuit may generate a condition signal in response to all of the active signal, current limit signal, and voltage limit signal being present. (e.g. simultaneously)

In some implementations, the deployment chip 210 may include a temperature sensor measuring the temperature of the high side transistor 224. An over temperature signal may be provided from the temperature sensor to the AND circuit 254. The AND circuit 254 may generate the condition signal based on one of or a combination of an over temperature signal, the active signal, the current limit signal, and the voltage limit signal. For example, the AND circuit 254 may generate the condition signal based on the current limit signal and the over temperature signal, or the voltage limit and the over temperature signal. In one particular implementation, the AND circuit 254 may generate a condition signal in response to all of the over temperature signal, active signal, current limit signal, and voltage limit signal being present. (e.g. simultaneously)

The delay timer 256 may start timing based on the condition signal being active. The delay timer 256 may help in situations where petaling of the canister may cause shorting, for example, to the inflator housing during normal deployment. The delay timer 256 count may reset once the counting condition is no longer met, (e.g. if one of the active signal, current limit signal, and voltage limit signal are not present). Alternatively in some implementations, the delay timer may accumulate across multiple periods where the triggering signals (active signal, current limit signal, and/or voltage limit signal) are present. The delay time counted by the delay timer 256 may be a fractional part of the deployment time (e.g. may be less than 1/10 th of the deployment time) As such in some implementations, the amount of time that the delay timer 256 counts may be less than 120 microseconds. The amount of time that the delay timer 256 counts may be set through by the digital control circuit 220, for example based on commands received over the communication interface 230. Once the delay timer has counted for a predetermined amount of time, the delay timer 256 may generate a disable signal to be provided to an OR circuit 258. If the OR circuit 258 receives the disable signal from the delay timer 256, the OR circuit 258 may generate a disable signal that is then provided to the high side gate circuit 222 to disable the power transistor 224.

The role of the high side short to battery & Faulty $SS_{xy}$ protection circuit 284 can be to allow the squib drivers to attempt deployment with a higher than expected or allowed $SS_{xy}$ pin voltage, due to either a HSD short to Vbat or a faulted $SS_{xy}$ regulation system (e.g. a fault in voltage regulator 282), for a definable period of time after which a detected fault will terminate deployment and keep the squib drivers from being destroyed or damaged.

A high side short to ground protection circuit 286 may include a comparator 260. The comparator 260 may be configured to compare the voltage at the high side feed terminal 244 to a reference voltage 262. As such, the comparator 260 may determine if the voltage at the high side feed terminal 244 is below a reference voltage and generate a voltage limit signal that indicates the voltage at the terminal 244 is less than the reference voltage. In addition, the high side gate driver circuit 222 may generate a current limit signal indicating that the current through the power transistor 224 has exceeded a current threshold. Further, the high side gate driver circuit 222 may generate an active signal indicating that high side gate driver has been activated, for example, by the digital control circuit 220. An AND circuit 264 may receive the voltage limit signal, the current limit signal, and the active signal. The AND circuit 264 may generate a condition signal that is provided to a delay timer 266. The AND circuit 264 may generate the condition signal based on the one of or a combination of the active signal, the current limit signal, and the voltage limit signal. For example, the AND circuit 264 may generate the condition signal based on the current limit signal and the voltage limit signal, or the voltage limit and the active signal. In one particular implementation, the AND circuit 264 may generate a condition signal in response to all of the active signal, current limit signal, and voltage limit signal being present. (e.g. simultaneously).

In some implementations, the deployment chip 210 may include a temperature sensor measuring the temperature of the high side transistor 224. An over temperature signal may be provided from the temperature sensor to the AND circuit 264. The AND circuit 264 may generate the condition signal based on one of or a combination of an over temperature signal, the active signal, the current limit signal, and the voltage limit signal. For example, the AND circuit 264 may generate the condition signal based on the current limit signal and the over temperature signal, or the voltage limit and the over temperature signal. In one particular implementation, the AND 264 circuit may generate a condition signal in response to all of the over temperature signal, active signal, current limit signal, and voltage limit signal being present. (e.g. simultaneously).

The delay timer 266 may start timing based on the condition signal being active. The delay timer 266 may help in situations where petaling of the canister may cause shorting for example to the inflator housing during normal deployment. The delay timer 266 count may reset once the counting condition is no longer met, (e.g. if one of the active signal, current limit signal, and voltage limit signal are not present). Alternatively, in some implementations, the delay timer may accumulate across multiple periods where the triggering signals (active signal, current limit signal, and/or voltage limit signal) are present. The delay time counted by the delay timer 266 may be a fractional part of the deployment time (e.g. may be less than 1/10 th of the deployment time) As such, in some implementations, the amount of time that the delay timer 266 counts may be less than 120 microseconds. The amount of time that the delay timer 266 counts may be set through by the digital control circuit 220, for example based on commands received over the communication interface 230. Once the delay timer has counted for a predetermined amount of time, the delay timer 266 may generate a disable signal to be provided to OR circuit 258. If the OR circuit 258 receives the disable signal from the delay timer 266, the OR circuit 258 may generate a disable signal that is then provided to the high side gate circuit 222 to disable the power transistor 224.

The role of the high side short to ground protection circuit 286 can be to allow the squib drivers to attempt deployment with a lower than expected or allowed $SF_x$ pin voltage, due to either a HSD $SF_x$ short to ground, for a definable period of time after which a detected fault will terminate deployment and keep the squib drivers from being destroyed or damaged.

A low side short to battery protection circuit 288 may include a comparator 270. The comparator 270 may be configured to compare the voltage at the low side return terminal 246 to a reference voltage 272. In some implementations, the voltage at the low side return terminal 246 may be scaled using a voltage divider 271. As such, the comparator 270 may determine if the voltage at the low side return terminal 246 exceeds a reference voltage and generate a voltage limit signal that indicates the voltage at the terminal 246 has exceeded the reference voltage. In some implementations, the reference voltage may be 5 volts or above. In addition, the low side gate driver circuit 232 may generate a current limit signal indicating that the current through the power transistor 234 has exceeded a current threshold. Further, the low side gate driver circuit 232 may generate an active signal indicating that low side gate driver has been activated, for example, by the digital control circuit 220. An AND circuit 274 may receive the voltage limit signal, the current limit signal, and the active signal. The AND circuit 274 may generate a condition signal that is provided to a delay timer 276. The AND circuit 274 may generate the condition signal based on the one of or a combination of the active signal, the current limit signal, and the voltage limit signal. For example, the AND circuit 274 may generate the condition signal based on the current limit signal and the voltage limit signal, or the voltage limit and the active signal. In one particular implementation, the AND circuit 274 may generate a condition signal in response to all of the active signal, current limit signal, and voltage limit signal being present. (e.g. simultaneously)

In some implementations, the deployment chip 210 may include a temperature sensor measuring the temperature of the low side transistor 234. An over temperature signal may be provided from the temperature sensor to the AND circuit 274. The AND circuit 274 may generate the condition signal based on one of or a combination of an over temperature signal, the active signal, the current limit signal, and the voltage limit signal. For example, the AND circuit 274 may generate the condition signal based on the current limit signal and the over temperature signal, or the voltage limit and the over temperature signal. In one particular implementation, the AND circuit 274 may generate a condition signal in response to all of the over temperature signal, active signal, current limit signal, and voltage limit signal being present. (e.g. simultaneously)

The delay timer 276 may start timing based on the condition signal being active. The delay timer 276 count may reset once the counting condition is no longer met, (e.g. if one of the active signal, current limit signal, and voltage limit signal are not present). Alternatively, in some implementations, the delay timer may accumulate across multiple periods where the triggering signals (active signal, current limit signal, and/or voltage limit signal) are present. The delay time counted by the delay timer 276 may be a fractional part of the deployment time (e.g. may be less than 1/10 th of the deployment time) As such, in some implementations, the amount of time that the delay timer 276 counts may be less than 120 microseconds. The amount of time that the delay timer 276 counts may be set through by the digital control circuit 220, for example based on commands received over the communication interface 230. Once the delay timer 276 has counted for a predetermined amount of time, the delay timer 276 may generate a disable signal to be provided to the low side gate circuit 232 to disable the power transistor 234.

The role of the low side short to battery protection circuit 288 can be to allow the squib drivers to attempt deployment with a higher than expected or allowed $SF_x$ pin voltage, due to either a LSD short to Vbat, for a definable period of time after which a detected short will terminate deployment and keep the squib drivers from being destroyed or damaged.

Considering all of the previous fault modes (Short to Ground, Shorted Squib Load, Short to Battery) the protection circuits illustrated in FIG. 8 provide significant benefits compared to the system illustrated in FIG. 1. The Energy absorbed by the HSD and LSD is the same as the system illustrated in FIG. 1 for a non-faulted system.

$$E\_HSD=[(V(SS_{x_0},0)-I\_All\text{-}Fire*(R\_Ignitor+Rdson\_LSD))*I\_All\text{-}Fire]*T\_All\text{-}Fire$$

$$E\_LSD=[(I\_All\text{-}Fire\text{\textasciicircum}2*(Rdson\_LSD)]*T\_All\text{-}Fire$$

Figure 9:
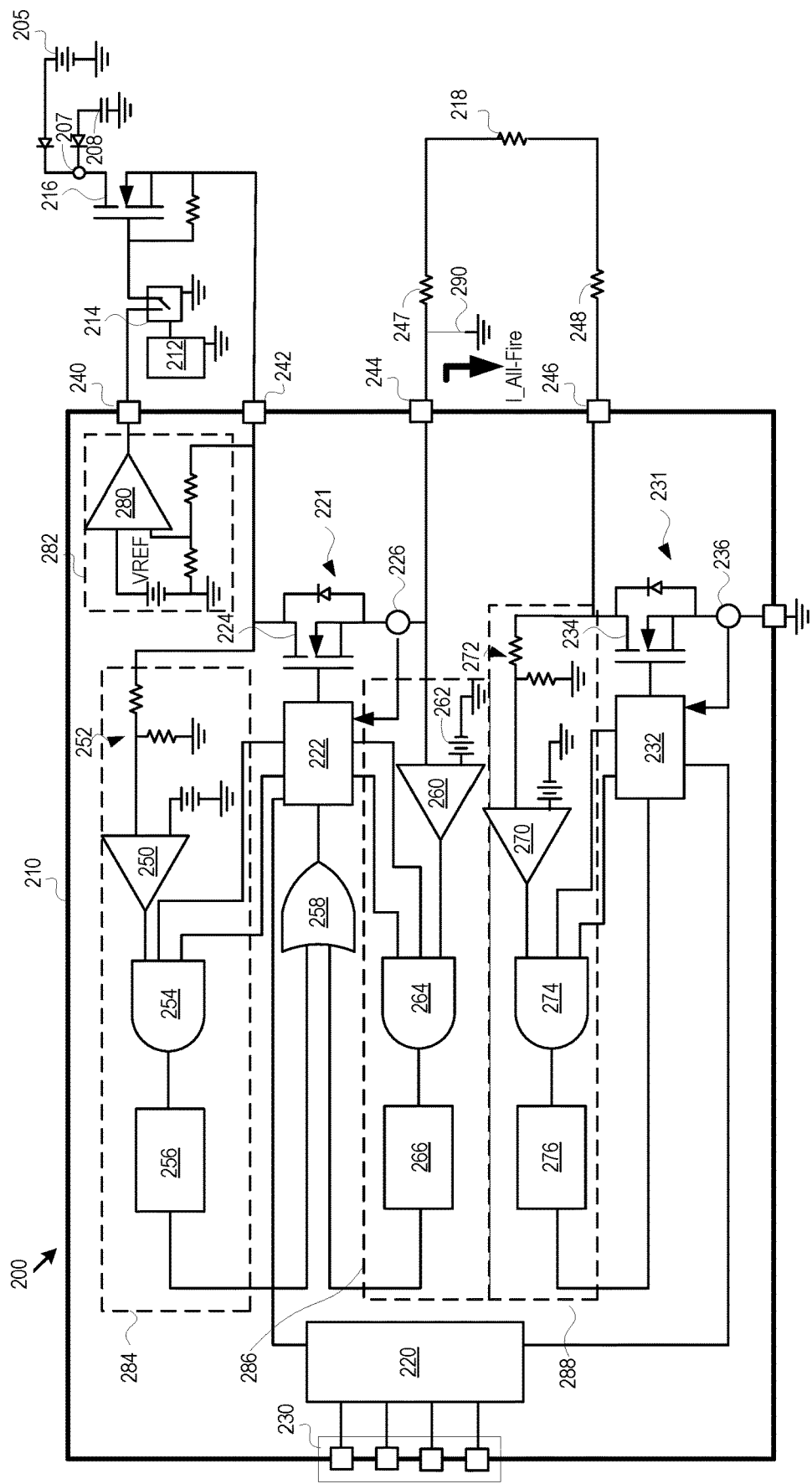
FIG. 9 is a schematic illustration of a short to ground fault for the squib driver circuit of FIG. 8.

One fault condition may include a short of the $SF_x$ (high side feed terminal 244) to ground. A simulated illustration of this fault is provided by the ground 290 in FIG. 9. Considering the system when driving a faulted condition of $SF_x$ pin short circuit to ground and impact to the HSD, the energy absorbed by the HSD and LSD is $$E\_HSD=[(V(SS_{x_0},0)-I\_All\text{-}Fire*(R\_Ignitor+Rdson\_LSD))*I\_All\text{-}Fire]*T\_Digital\_Delay2$$

$$E\_LSD=0 \text{ Joules}$$

Where T_Digital_Delay2 is the amount of time that a fault condition is detected by the timer 266 before the switch controller 222 is deactivated (e.g. 10-250 μseconds).

This E_HSD result is now reduced from T_All-Fire to T_Digital_Delay2 when compared with the system illustrated in FIG. 1. (25E-06/500E-06=1/20 of the energy).

Figure 10:
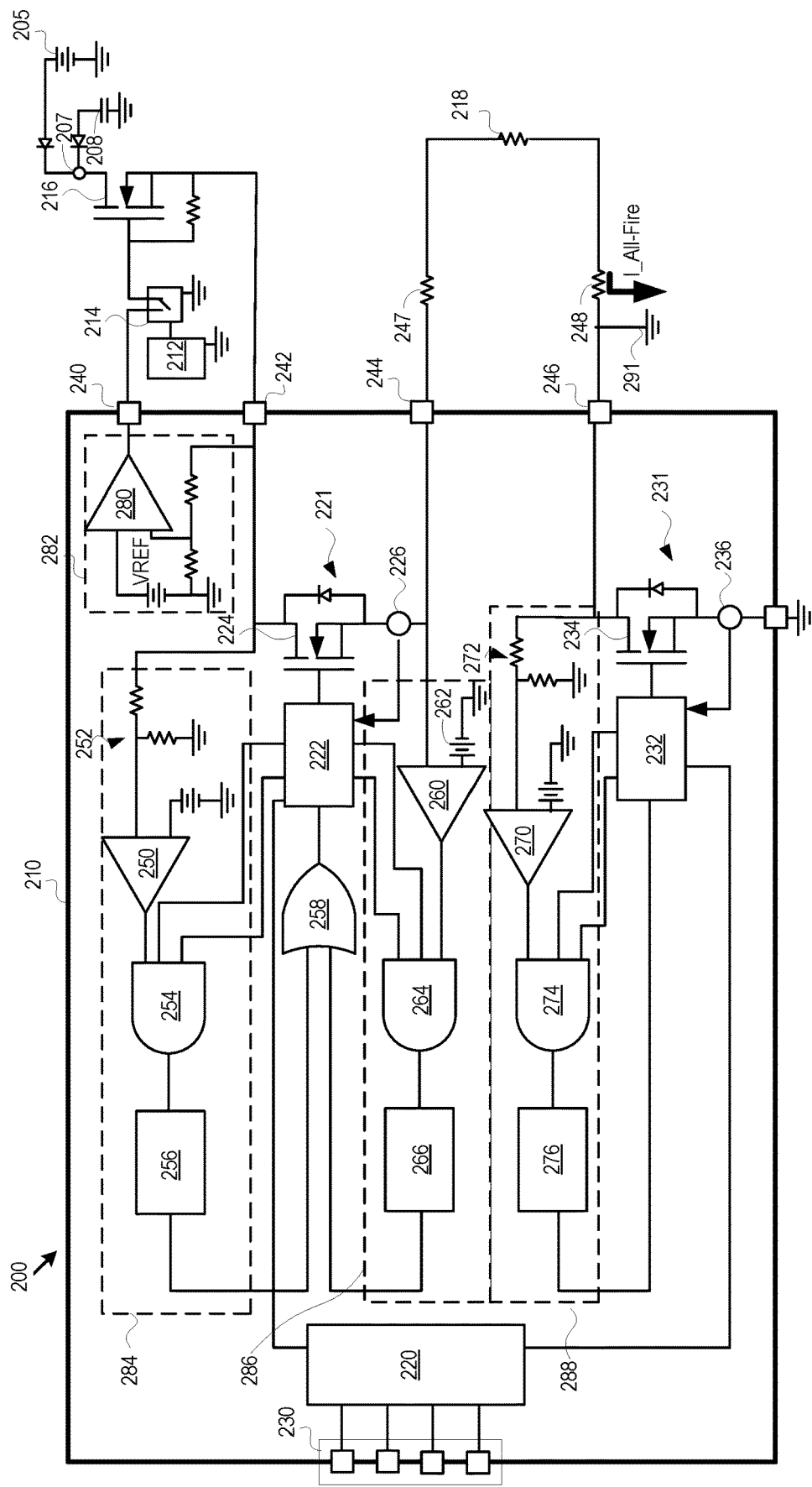
FIG. 10 is a schematic illustration of a short to ground fault for the squib driver circuit of FIG. 8.

One fault condition may include a short of the $SR_x$ pin (low side return terminal 246) to ground. A simulated illustration of this fault is provided by the ground 291 in FIG. 10. Considering the system when driving a faulted condition of $SR_x$ pin short circuit to ground and impact to the HSD, the energy absorbed by the HSD and LSD is $$E\_HSD=[(V(SS_{x_0},0)-I\_All\text{-}Fire*(R\_Ignitor+Rdson\_LSD))*I\_All\text{-}Fire]*T\_Digital\_Delay2$$

$$E\_LSD=0 \text{ Joules}$$

This E_HSD result is now reduced from T_All-Fire to T_Digital_Delay2 when compared with the system illustrated in FIG. 1. (25E-06/500E-06=1/20 of the energy).

Figure 11:
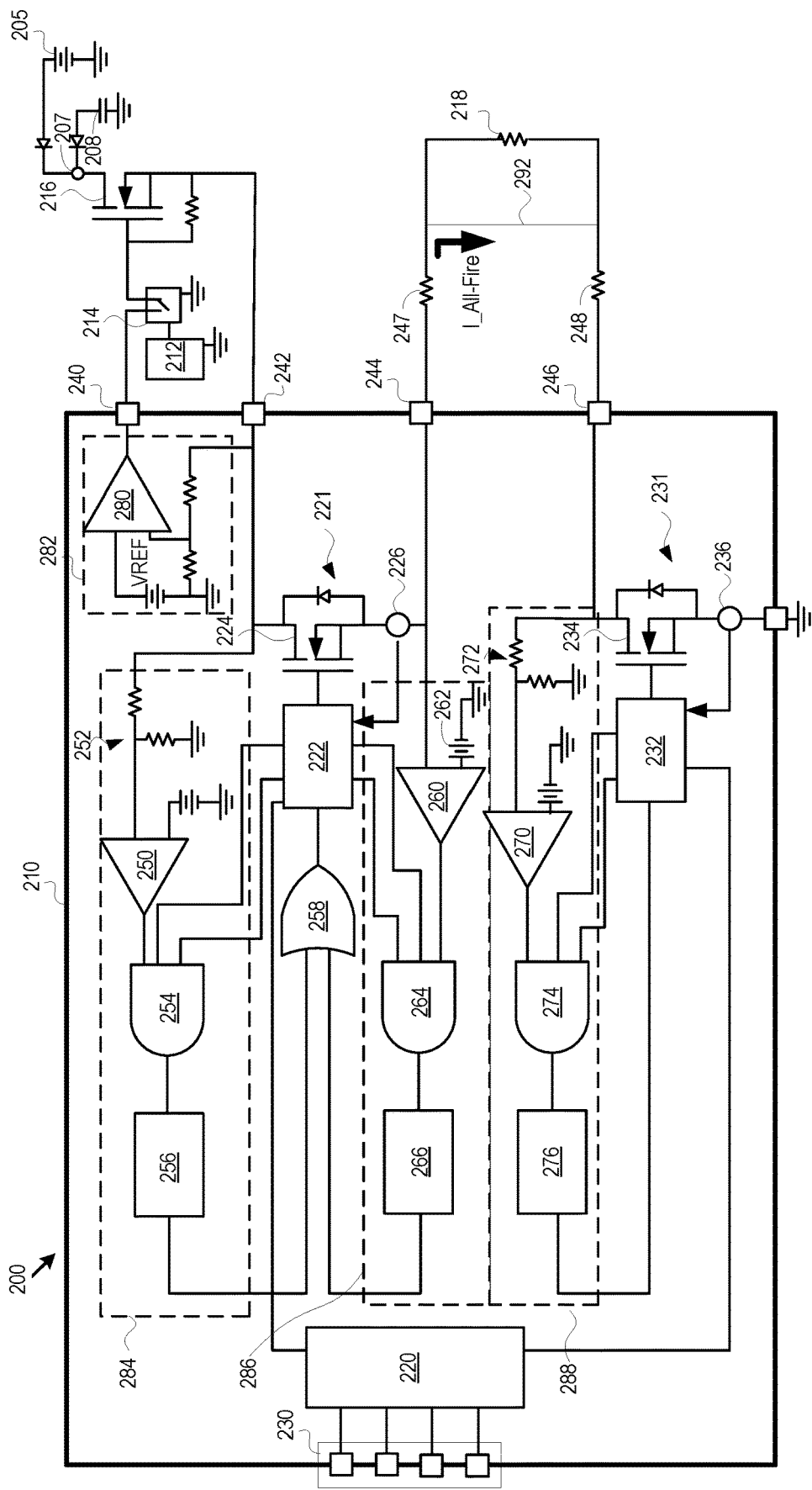
FIG. 11 is a schematic illustration of a shorted squib load fault for the squib driver circuit of FIG. 8.

Another fault condition may include a short of the $SF_x$ pin (high side feed terminal 244) to the $SR_x$ pin (low side return terminal 146). A simulated illustration of this fault is provided by the shunt 292 in FIG. 11. Considering the system when driving a faulted condition of $SF_x$ pin Short to $SR_x$ pin (shorted squib load) and impact to the HSD, the Energy absorbed by the HSD and LSD is $$E\_HSD=[(V(SS_{x_0},0)-I\_All\text{-}Fire*(R\_Ignitor+Rdson\_LSD))*I\_All\text{-}Fire]*T\_Digital\_Delay2$$

$$E\_LSD=0 \text{ Joules}$$

This E_HSD result is now reduced from T_All-Fire to T_Digital_Delay2 when compared to the system illustrated in FIG. 1. (25E-06/500E-06=1/20 of the energy).

Figure 12:
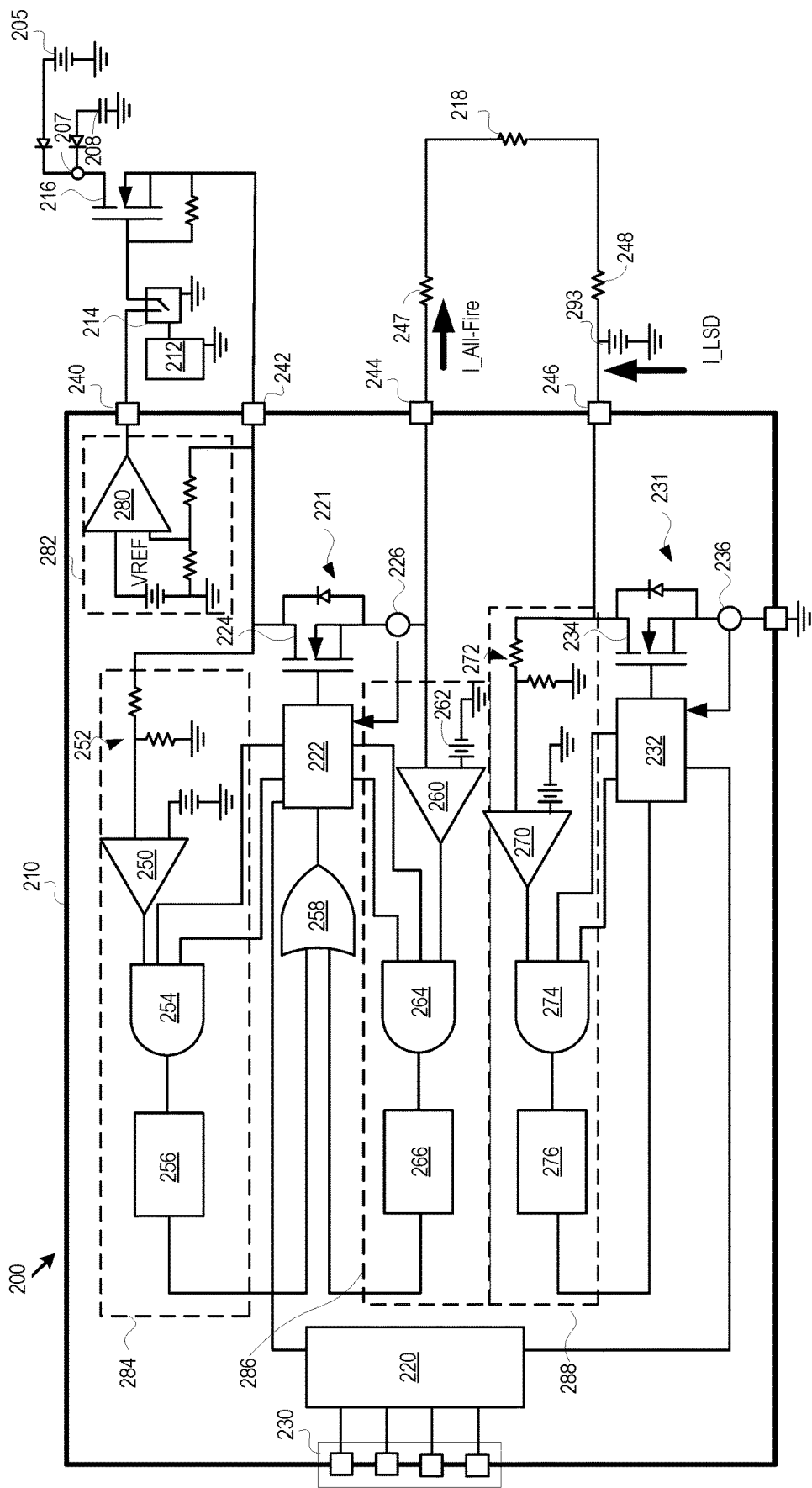
FIG. 12 is a schematic illustration of short to battery fault for the squib driver circuit of FIG. 8.

Another fault condition may include a short of the $SR_x$ pin (low side return terminal 246) to battery voltage. A simulated illustration of this fault is provided by the battery 293 in FIG. 12. Considering the system when driving a faulted condition of $SR_x$ pin short circuit to Vbat and impact to the LSD, the energy absorbed by the HSD and LSD is $$E\_HSD=[(V(SS_{xy},0)-(I\_All\text{-}Fire*R\_Ignitor)-Vbat)*I\_All\text{-}Fire]*T\_Digital\_Delay2$$

$$E\_LSD=[I\_LSD*Vbat]*T\_Digital\_Delay3$$

Where T_Digital_Delay3 is the amount of time that a fault condition is detected by the timer 276 before the switch controller 232 is deactivated (e.g. 10-250 μseconds).

The E_HSD result is now reduced from T_All-Fire to T_Digital_Delay3 compared to the system illustrated in FIG. 1. (25E-06/500E-06=1/20 of the energy). The E_LSD result is now reduced from T_All-Fire to T_Digital_Delay3 compared to the system illustrated in FIG. 1. (25E-06/500E-06=1/20 of the energy)

Figure 13:
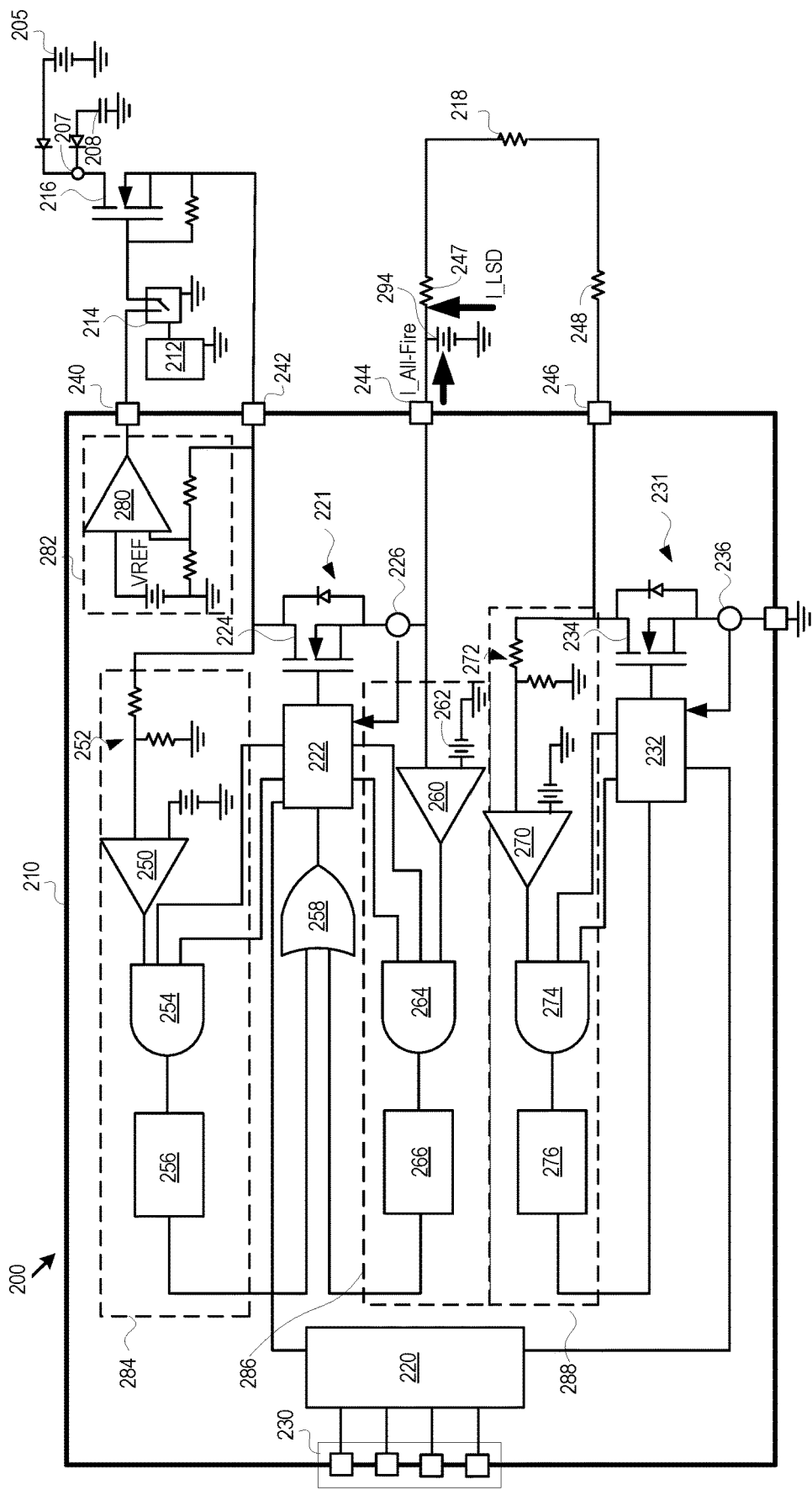
FIG. 13 is a schematic illustration of short to battery fault for the squib driver circuit of FIG. 8.

Another fault condition may include a short of the $SF_x$ pin (high side feed terminal 244) to battery voltage. A simulated illustration of this fault is provided by the battery 294 in FIG. 13. Considering the system when driving a faulted condition of $SF_x$ pin short circuit to Vbat and impact to the LSD, the energy absorbed by the HSD and LSD is $$E\_HSD=[(V(SS_{xy},0)-Vbat)*I\_All\text{-}Fire]*[T\_All\_Fire]$$

$$E\_LSD=[(Vbat-(I\_LSD*R\_Ignitor))*I\_LSD]*T\_Digital\_Delay3$$

The E_HSD result is the same from T_All-Fire to T_All-Fire when compared with the system illustrated in FIG. 1. (500E-06/500E-06=1/1 of the energy). The E_LSD result is now reduced from T_All-Fire to T_Digital_Delay3 compared with the system illustrated in FIG. 1. (25E-06/500E-06=1/20 of the energy).

Figure 14:
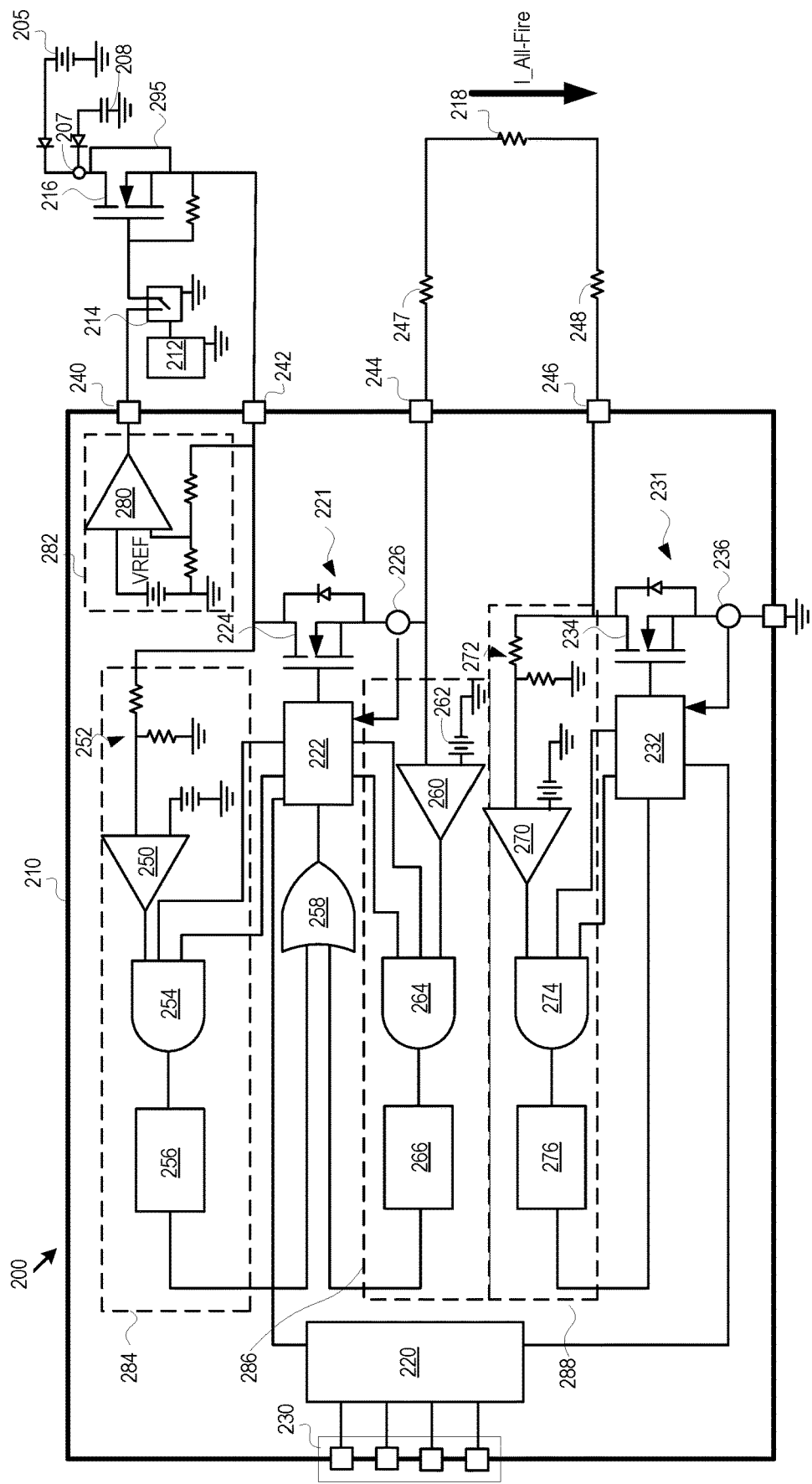
FIG. 14 is a schematic illustration of a faulty external transistor for the squib driver circuit of FIG. 8.

Another fault condition may include a faulty external transistor. A simulated illustration of this fault is provided by the shunt 295 in FIG. 14. Considering the system when driving a faulted condition of external transistor and impact to the HSD, the energy absorbed by the HSD and LSD is $$E\_HSD=[((V_{ER})-I\_All\text{-}Fire*(R\_Ignitor+Rdson\_LSD))*I\_All\text{-}Fire]*T\_Digital\_Delay1$$

$$E\_LSD=[I\_All\text{-}Fire^2*(Rdson\_LSD)]*T\_Digital\_Delay3$$

Where $V_{ER}$ is the voltage at node 207 (e.g. 33V) and Digital_Delay1 is the amount of time that a fault condition is detected by the timer 256 before the switch controller 222 is deactivated (e.g. 10-250 μseconds).

The E_HSD result is now reduced from T_All-Fire to T_Digital_Delay1 compared to the system illustrated in FIG. 1. (25E-06/500E-06=1/20 of the energy). The E_LSD result is now reduced from T_All-Fire to T_Digital_Delay3 compared to the system illustrated in FIG. 1. (25E-06/500E-06=1/20 of the energy).

The methods, devices, processing, and logic described above may be implemented in many different ways and in many different combinations of hardware and software. For example, all or parts of the implementations may be circuitry that includes an instruction processor, such as a Central Processing Unit (CPU), microcontroller, or a microprocessor; an Application Specific Integrated Circuit (ASIC), Programmable Logic Device (PLD), or Field Programmable Gate Array (FPGA); or circuitry that includes discrete logic or other circuit components, including analog circuit components, digital circuit components or both; or any combination thereof. The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples.

The circuitry may further include or access instructions for execution by the circuitry. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed as circuitry among multiple system components, such as among multiple processors and memories, optionally including multiple distributed processing systems. Parameters, databases, and other data structures may be separately stored and managed, may be incorporated into a single memory or database, may be logically and physically organized in many different ways, and may be implemented in many different ways, including as data structures such as linked lists, hash tables, arrays, records, objects, or implicit storage mechanisms. Programs may be parts (e.g., subroutines) of a single program, separate programs, distributed across several memories and processors, or implemented in many different ways, such as in a library, such as a shared library (e.g., a Dynamic Link Library (DLL)). The DLL, for example, may store instructions that perform any of the processing described above or illustrated in the drawings, when executed by the circuitry.

As a person skilled in the art will readily appreciate, the above description is meant as an illustration of the principles of this disclosure. This description is not intended to limit the scope or application of this disclosure in that the systems and methods are susceptible to modification, variation and change, without departing from spirit of this disclosure, as defined in the following claims.

What is claimed is:

1. A squib driver circuit for deployment of a deployable restraint in a vehicle, the squib driver circuit comprising:
    an integrated circuit formed on a single chip including:
        an input terminal for receiving an input voltage used to fire the deployable restraint,
        a high side feed terminal configured for communication with the deployable restraint, a low side return terminal configured for communication with the deployable restraint,
        a high side driver configured to supply current from the input terminal to the high side feed terminal, and
        a low side driver configured to supply current from the low side return terminal to an electrical ground; and
    a voltage regulator configured to regulate the input voltage at the input terminal to a minimum firing voltage to deploy the deployable restraint, wherein the voltage regulator includes at least one circuit component independent of the integrated circuit.

2. The squib driver circuit of claim 1, wherein the voltage regulator is entirely independent of the integrated circuit.

3. The squib driver circuit of claim 1, wherein the integrated circuit includes a portion of the voltage regulator.

4. The squib driver circuit of claim 1, wherein an input of the voltage regulator is connected to the input terminal.

5. The squib driver circuit of claim 1, wherein the voltage regulator comprises an amplifier.

6. The squib driver circuit of claim 5, wherein the amplifier has an output that is connected to an output terminal to control an external switching transistor.

7. The squib driver circuit of claim 6, wherein the amplifier has an input that is connected to the input terminal through a voltage divider.

8. The squib driver circuit of claim 1, wherein the voltage regulator is configured to reduce variation of the input voltage at the input terminal.

9. A system for deployment of a deployable restraint in a vehicle;
a squib driver circuit comprising an integrated circuit formed on a single chip, the single chip including: an input terminal for receiving an input voltage used to fire the deployable restraint, a high side driver configured to supply current from the input terminal to the deployable restraint, and a low side driver configured to supply current from the deployable restraint to an electrical ground;
a voltage regulator configured to regulate the input voltage at the input terminal to a minimum firing voltage to deploy the deployable restraint, the voltage regulator including at least one circuit component independent of the integrated circuit; and
a transistor independent of the integrated circuit, the transistor being connected between a battery and the input terminal.

10. The system of claim 9, wherein the voltage regulator is entirely independent of the integrated circuit.

11. The system of claim 9, wherein the integrated circuit includes a portion of the voltage regulator.

12. The system of claim 9, wherein an input of the voltage regulator is connected to the input terminal.

13. The system of claim 9, wherein an output of the voltage regulator is connected to the transistor.

14. The system of claim 9, wherein the voltage regulator comprises an amplifier.

15. The system of claim 14, wherein the amplifier has an output to control the transistor.

16. The system of claim 14, wherein the amplifier has an input that is connected to the input terminal through a voltage divider.

17. The system of claim 9, wherein the voltage regulator is configured to reduce variation of the input voltage at the input terminal.

18. A squib driver circuit for deployment of a deployable restraint in a vehicle, the squib driver circuit comprising:
an integrated circuit formed on a single chip including:
an input terminal for receiving an input voltage used to fire the deployable restraint,
a high side feed terminal in communication with the deployable restraint,
a low side return terminal in communication with the deployable restraint,
a high side driver configured to supply current from the input terminal to the high side feed terminal,
a low side driver configured to supply current from the low side return terminal to an electrical ground, and
a high side short to battery voltage protection circuit configured to allow an all fire current from the high side feed terminal until a short circuit is detected between the high side feed terminal and a battery voltage for a predetermined period of time and disable the high side driver after the short circuit is detected and elapse of the predetermined period of time; and
a voltage regulator configured to regulate the input voltage at the input terminal to a minimum firing voltage to deploy the deployable restraint, wherein the voltage regulator includes at least one circuit component independent of the integrated circuit.

19. The squib driver circuit of claim 18, wherein the voltage regulator is entirely independent of the integrated circuit.

20. The squib driver circuit of claim 18, wherein the integrated circuit includes a portion of the voltage regulator.

* * * * *